(12) United States Patent
Morrill

(10) Patent No.: US 7,248,122 B2
(45) Date of Patent: Jul. 24, 2007

(54) METHOD AND APPARATUS FOR GENERATING A SERIAL CLOCK WITHOUT A PLL

(75) Inventor: David P. Morrill, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/226,047

(22) Filed: Sep. 14, 2005

(65) Prior Publication Data

US 2007/0057827 A1 Mar. 15, 2007

(51) Int. Cl.
*H03L 7/085* (2006.01)

(52) U.S. Cl. .......................... 331/1 A; 331/17

(58) Field of Classification Search ............... 331/1 A, 331/10, 25, 17; 327/156, 175
See application file for complete search history.

(56) References Cited

U.S. PATENT DOCUMENTS

| | | | |
|---|---|---|---|
| 4,556,850 A | 12/1985 | McBrien | |
| 4,561,014 A | 12/1985 | Douziech et al. | |
| 4,680,733 A | 7/1987 | Duforestel et al. | |
| 4,689,740 A | 8/1987 | Moelands et al. | |
| 4,809,166 A | 2/1989 | Cooper | |
| 4,841,549 A | 6/1989 | Knapp | |
| 5,138,634 A | 8/1992 | Knapp | |
| 5,168,245 A | 12/1992 | Koskowich | |
| 5,559,502 A | 9/1996 | Schutte | |
| 5,668,830 A | 9/1997 | Georgiou et al. | |
| 5,889,829 A * | 3/1999 | Chiao et al. ................. | 375/376 |
| 5,907,566 A | 5/1999 | Benson et al. | |
| 6,031,473 A | 2/2000 | Kubinec | |
| 6,169,501 B1 | 1/2001 | Ryan | |
| 6,181,209 B1 * | 1/2001 | Tsai ........................... | 331/1 A |
| 6,266,710 B1 | 7/2001 | Dittmer et al. | |

(Continued)

FOREIGN PATENT DOCUMENTS

DE        2521731 B1    10/1976

(Continued)

OTHER PUBLICATIONS

Fowler, Michael L. et al., Bit Clock With Embedded Word Clock Boundary, Mar. 6, 2004, U.S. Appl. No. 10/802,436.

(Continued)

*Primary Examiner*—Linh Nguyen
(74) *Attorney, Agent, or Firm*—Edwin H. Paul, Esq.; Cesari and McKenna, LLP

(57) ABSTRACT

A clock circuit for outputting serial data without using a PLL is described. The clock is a VCO designed to start at a frequency that is slightly higher than necessary to preserve the data. The frequency of the clock is measured and if the frequency is too high or too low the DC control voltage for the VCO is changed to bring the VCO frequency back to the start frequency. Clock counters, holding registers, comparators, and a D/A form a feed back path around a VCO. In addition, a word boundary generator is used to define individual data words. The word boundary is formed by the absence of a bit clock transition while there is a data bit transition. A high/low threshold may be used where the VCO frequency, as measured, must transcend a threshold before the DC control voltage to the VCO is changed.

10 Claims, 6 Drawing Sheets

U.S. PATENT DOCUMENTS

| | | |
|---|---|---|
| 6,377,575 B1 | 4/2002 | Mullaney et al. |
| 6,396,888 B1 | 5/2002 | Notani et al. |
| 6,397,042 B1 | 5/2002 | Prentice et al. |
| 6,496,540 B1 | 12/2002 | Widmer |
| 6,516,952 B1 | 2/2003 | Wang et al. |
| 6,542,096 B2 | 4/2003 | Chan et al. |
| 6,593,863 B2 | 7/2003 | Pitio |
| 6,653,957 B1 | 11/2003 | Patterson et al. |
| 6,664,828 B2 * | 12/2003 | Gauthier et al. ............ 327/157 |
| 6,693,918 B1 | 2/2004 | Dallabetta et al. |
| 6,774,732 B1 * | 8/2004 | Harnishfeger et al. ........ 331/25 |
| 6,799,239 B2 | 9/2004 | VanKrevelen |
| 6,864,753 B2 * | 3/2005 | Lee et al. ..................... 331/17 |
| 6,880,056 B2 | 4/2005 | Kootstra |
| 6,892,337 B1 | 5/2005 | Brophy et al. |
| 6,970,046 B2 * | 11/2005 | Da Dalt et al. ............... 331/16 |
| 6,985,546 B2 | 1/2006 | Kumata |
| 6,998,922 B2 * | 2/2006 | Jensen et al. ................. 331/17 |
| 7,023,284 B2 * | 4/2006 | Sogawa et al. ............... 331/10 |
| 7,064,690 B2 | 6/2006 | Fowler et al. |
| 2004/0236977 A1 | 11/2004 | Kizer et al. |

FOREIGN PATENT DOCUMENTS

| | | |
|---|---|---|
| JP | 60107938 | 6/1985 |
| JP | 02260734 | 10/1990 |
| WO | 2004047345 A1 | 6/2004 |

OTHER PUBLICATIONS

Fowler, Michael L. et al., Architecture For Bidirectional Serializer and De-Serializer, Mar. 6, 2004, U.S. Appl. No. 10/802,372.

International Search Report dated May 18, 2005 for Related Appliation No. PCT/US2005/007944.

International Search Report dated May 18, 2005 for Related Application No. PCT/US2005/007945.

International Search Report dated Dec. 6, 2005 for Related Application No. PCT/US2005/009311.

* cited by examiner

METHOD AND APPARATUS FOR GENERATING A SERIAL CLOCK WITHOUT A PLL

CROSS REFERENCE TO RELATED APPLICATIONS

This application is related to commonly owned, U.S. applications, Ser. No. 10/802,372, filed Mar. 16, 2004 entitled ARCHITECTURE FOR BIDIRECTIONAL SERIALIZERS AND DESERIALIZERS; Ser. No. 10/802,436, filed Mar. 16, 2004 entitled BIT CLOCK WITH EMBEDDED WORD CLOCK BOUNDARY and Ser. No. 10/824,747, filed Apr. 15, 2004 entitled SENDING AND/OR RECEIVING SERIAL DATA WITH BIT TIMING AND PARALLEL DATA CONVERSION. These applications are incorporated herein by reference.

BACKGROUND OF THE INVENTION

1. Field of the Invention

The present invention relates to data transmission, and more particularly to serializing and sending, bit by bit, a data word and a bit clock with an embedded data word boundary.

2. Background Information

FIG. 1 illustrates a known serializer in a block schematic form. A parallel data word 10 is loaded into a buffer register 12 with a word clock 14. The word clock 14 is also fed to a phase locked loop (PLL) or a delay locked loop (DLL) 16, hereinafter PLL will be used to refer to both the PLL and DLL. The PLL generates a bit clock 18 that loads the shift register 20 and subsequently shifts out the data in the shift register 20 serially bit by bit through a cable or transmission line driver 22. The bit clock 18 that shifts the data out bit by bit stays synchronized to the bit positions within the word by the PLL. Along with the serial bits from driver 22, a word clock 24 is output via driver 26. The receiver will be able to distinguish the beginning and ending of the serial data stream by referencing the bit stream via the word clock.

FIG. 2 shows a receiver circuit that de-serializes the bits to form words. The serial data 30 is input to a shift register 32. The word clock 34 is input to a PLL 36 that generates a bit clock 38 that is synchronized to the bit location in a word by the PLL. With this synchronization, the bit clock 38 properly loads the bit stream into the shift register 32. When the word has been received by the shift register 32 (as determined from the word clock), the PLL outputs a clock 40 that loads the parallel data in the shift register 32 into a buffer register 42. The word data 44 is in parallel form ready for use in the receiving system.

FIGS. 1 and 2 contain a buffer register that holds the word to be sent or the word just received. The buffer allows nearly the entire time for a word to be sent or received before the next word is loaded. The logic and the timing to accomplish these tasks are well known. However, the buffer registers are not required, and if not used, then the word to be sent and the word received must be loaded during a bit time. Again, such designs are well known in the art.

FIG. 3 shows a complete bidirectional system using the serializers as in FIG. 1 and de-serializers as in FIG. 2. Note that there are eight data lines and a single clock into each serializer and out from each de-serializer. The data and clock lines between the serializer and the de-serializer are typically differential signals each using two conductors.

The serializer/de-serializers of FIG. 3 each contain a PLL that are common in such devices. But, PLL's consume significant power, are complex, require long locking times, and occupy considerable chip real estate. It would be advantageous to dispense with PLL's.

FIG. 4 shows a generic timing chart that illustrates the serial sending of a data word. A word clock 60 is fed to a PLL that generates a synchronous bit clock 62, the word clock 60 must occur often enough for the PLL to remain locked. The data bits are loaded into a shift register using a word clock edge. Then, the data bits in the shift register are shifted out serially by the bit clock 62. In FIG. 4 an eight bit word is shifted out on the rising edge of the bit clock 62.

A similar operation applies to the receiving of the serial data. In FIG. 2, a word clock 34 is received and applied to a PLL 36 that generates a synchronous (to the word clock) bit clock that is used to load the data bits into a receiving shift register. Data bits must be stable when the clocks cause the data bits to be sent and to be received. Time delays are designed into such systems to accomplish this, as known in the art. In the case shown, the data bits are sent out synchronously where the first bit of the next word is sent out directly after the last bit of the prior word. In other instances the data may be sent out asynchronously, typically using a start and stop bit that frames the data bits. In both the synchronous and asynchronous cases, system means must be employed, as are well known in the art, to prepare the sender and the receiver to properly send and receive the data. Also, systems are arranged to send data, then, after sending, to receive data; while other systems can send and receive simultaneously. The former is referred to as half duplex and the latter as duplex. Again, system designers understand the limitations and requirements of such systems to properly send and receive data.

It is axiomatic that the receiving system must be able to distinguish data bits and word boundaries from a stream of serial bits, as discussed above. U.S. Pat. No. 4,841,549 to Knapp sends serial data with a bit clock. In this application, the bit clock, traveling with the data bits, is received by a re-triggerable; a one-shot. When a word boundary is created by the sender, a bit clock is not sent. The receiver one-shot times out and the ensuing missing bit clock is interpreted as a word boundary. In this case, the re-triggerable one-shot must be carefully set to receive the bit clocks in order to trigger and to time out properly. This approach is limited by requiring an accurate one-shot set up and then the use of a set bit clock that cannot change. The present invention employs a different approach and circuit compared to the Knapp patent, and the present invention is not so limited in its applications.

In general, transferring serial data offers an advantage that the cable running between the sending and receiving systems need only have a few signals (if differential signals, one data pair and one clock pair) carrying wires (and, of course, if not differential, a common return wire could be used). In contrast, sending data over cables in parallel requires line drivers for each bit in a word and, at least, a clock driver. These parallel drivers consume high power and output high currents that create significant system noise.

In applications where cables or transmission lines are not used, but where parallel data is sent between integrated circuit packages, many pins on those packages must be set aside for each bit of the parallel data. In the newer designs, using sixty-four and one hundred and twenty-eight bits, the pins available on the packages become a design limitation. Larger packages and ball grid array and similar packages that provide pins over the entire bottom surface of a package address this problem. However, the problem persists. Applications that may suffer from these limitations include virtually all computing systems with complex displays, e.g. cell phones, desk-top and lap top computers, electronic games, computing systems with off-chip memory, any computing system addressing bulk memory, and electronic instrumentation, monitoring and controlling equipment.

Up to the present time, serializing and de-serializing data entails using PLL's that are complex and costly of power chip space and time, as discussed above. Serializing and de-serializing would find greater acceptance if these limitations were removed.

SUMMARY OF THE INVENTION

The present invention provides a method and apparatus demonstrating low power dissipation and an efficient die size circuit for sending data serially. It also reduces design time by eliminating complexity of designing PLL's, while eliminating the lock time required by PLL's.

The present invention includes a clock circuit for outputting serial data bits and for defining or framing or setting the boundaries of a data word. A VCO (voltage controller oscillator) starts immediately upon receipt of an enable signal and outputs clock pulses with a frequency responsive to the control input signal. At power up, the DC control inputs to the VCO, and the VCO output frequency is designed at a set level that is higher than that required to preserve data bit integrity. The VCO clock frequency is measured and compared to the set level, and if the clock frequency is higher than the set level, the DC control input is reduced to lower the VCO frequency. If the clock frequency is lower than the set level, the DC control input is raised to speed up the clock frequency.

In practical applications, systems transferring serial data must find the beginning and the end of the data word. That end being after the last data bit of one word is sent and before the sending of the first data bit of a second word. In a preferred embodiment, that end of the data word, if formed by the bit clock, has no logic level transitions while there is a logic level transition on the data bit line. If, after a data word boundary is detected, the additional data bit of bits (there could be several data transitions) are just discarded.

In yet another preferred embodiment, there are two outputs from the VCO clock timing comparator. One is a speedup signal and the other a slowdown signal. These signals are sent to the D/A circuitry where the DC control output is raised or lowered, respectively.

In yet another illustrative example, a high clock and a low clock threshold are built into the control circuitry. In this example, the high and low counter values from the bit clock counter must traverse the thresholds before the VCO frequency is changed.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
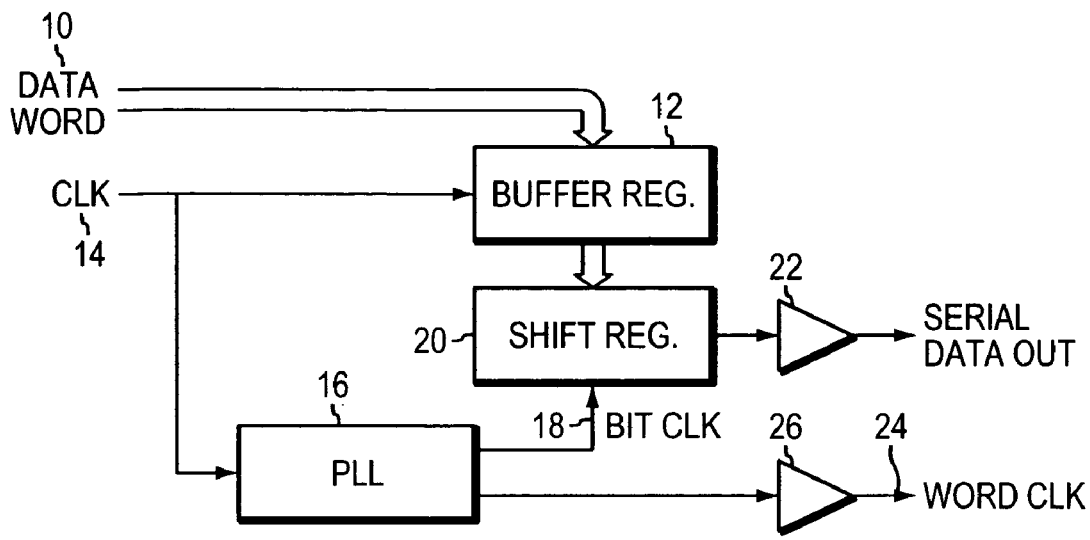
FIGS. 1, 2 and 3 are block diagram schematics of a prior art serializer and de-serializer.
Figure 2:
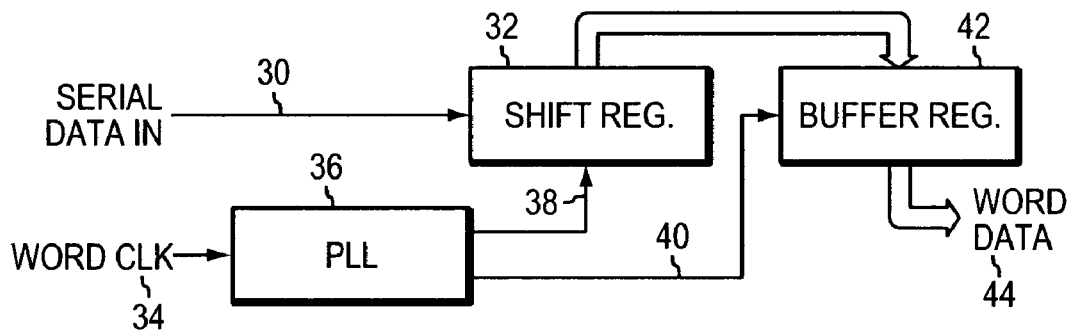
Figure 3:
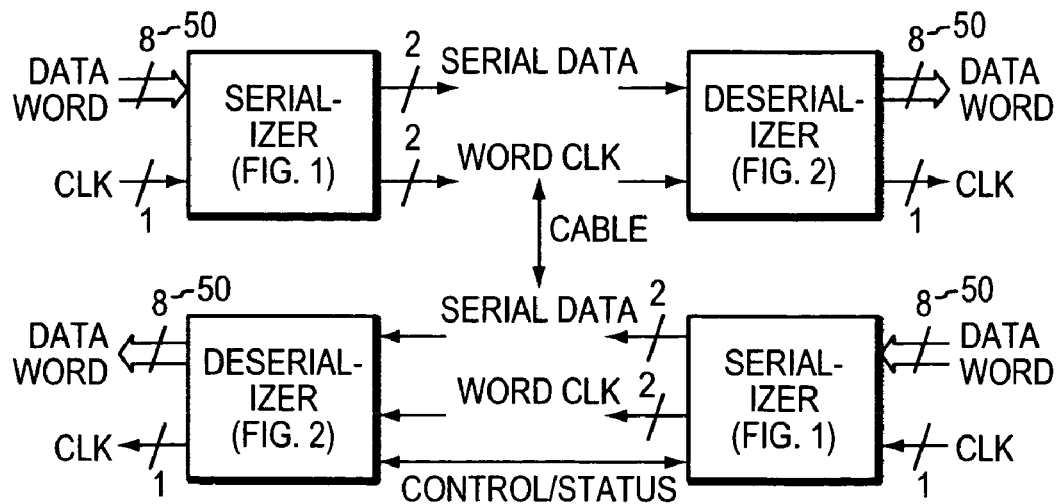
Figure 4:
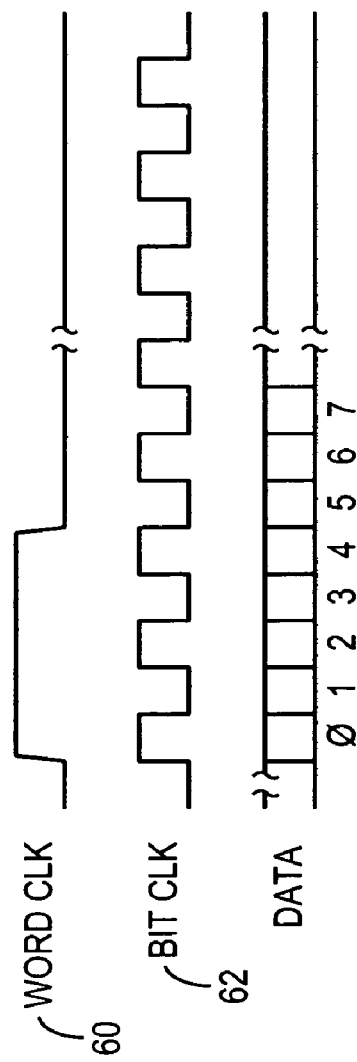
FIG. 4 is a representative prior art timing diagram.
Figure 5:
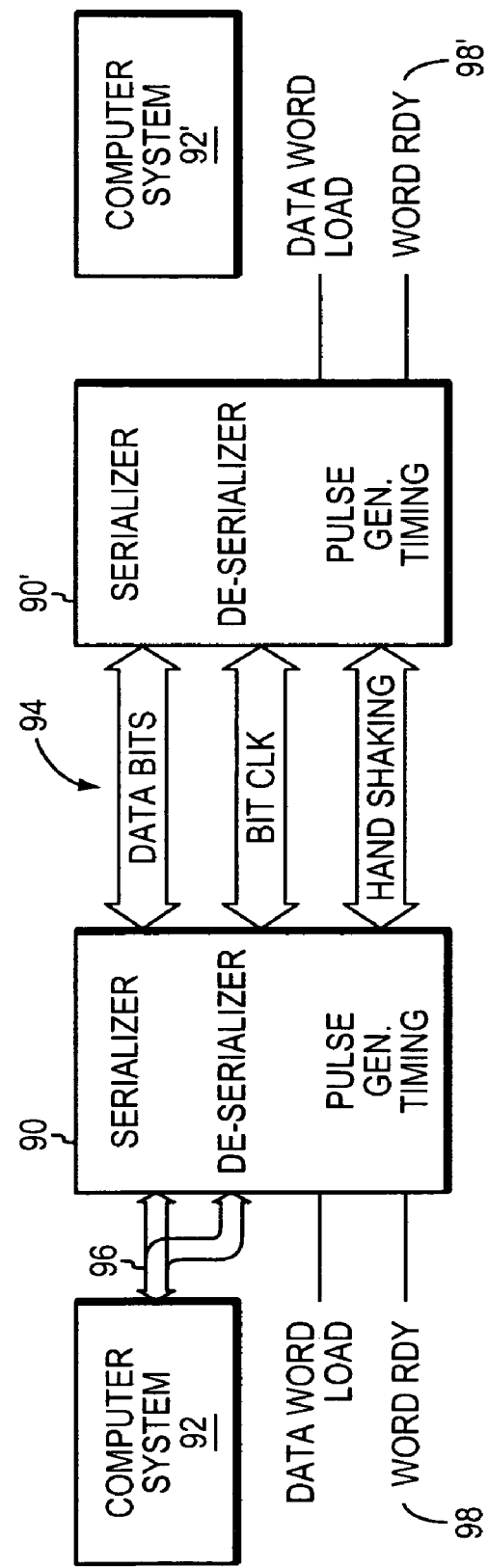
FIG. 5 is a block diagram of a system incorporating the present invention.

Practitioners in the art know that many variations of the system illustrated in FIG. 5 are possible. The following descriptions are illustrative and those practitioners in the art will know of, or develop, other configurations that may advantageously use the present invention.

FIG. 5 shows computer systems 92 and 92' that may be virtually any electronic systems where parallel data is available for reading or writing. That is, besides usual computer systems, camera electronics, memory electronics, keyboards, scanners, print heads, wireless communications, etc., are among other such systems known in the art that may employ the present invention.

Most practical systems that may use the present invention, will typically employ "handshaking" signals to indicate the status of a data receiver or sender. Some systems, however, may simply send out data continuously at a regular rate without using any handshaking. For example, handshaking signals may be used to control which system is sending and which is receiving. The following descriptions focus on the serial data transfer, regardless of status "handshaking." But, it is understood that handshaking may or may not be employed with the present invention.

The computer system 92 interfaces with a serializer/de-serializer 90 via a parallel data port or connector. The serializer portion of item 90 serializes the parallel data and sends it to the de-serializer portion of 90,' where that data is de-serialized and read in parallel by the computer system 92.' Data maybe transferred from computer system 92' to 92 in a similar fashion, as controlled by handshaking signals that turn the directions around. In one preferred embodiment, there may be only a serializer in 90 and only a de-serializer in 90.' However, in most applications there will be both a serializer and a de-serializer, as shown, in both systems 90 and 90,' and communications will occur in both directions.

The parallel interfaces 96 and 96' have parallel data usually arranged in a bi-directional bus with buffers enabled depending on the direction of the data. The parallel interface also shows two generic control lines, WORD LOAD and RDY 98 and 98.' As shown, these lines do not have a direction symbol since they may originate in either the computer systems or the serializer/de-serializer. In one embodiment, the computer system 92, when RDY is true, will load the next word into the serializer/de-serializer with the WORD LOAD signal. However, in another arrangement, the serializer may, after sending out a data word, assert the WORD LOAD signal to strobe in a new parallel word from the computing system 92. The computing system would then use the WORD LOAD to bring up the next word to be serialized.

When the computer system 92 or 92' is receiving a parallel data word from the de-serializer, the RDY line can be used as an indication that the data word is available over the data lines 96. However, in another arrangement, the RDY signal may be used to strobe the data into the computer system. For example, if the data were going directly into a memory system, the RDY signal may strobe in the data word and also increment an address counter to have the memory pointing to the next location. In the following descriptions, the RDY and the WORD LOAD signal may be described with other acronyms that are easily understood to be functionally equivalent.

Of note in FIG. 5, there is no PLL circuitry in the inventive serializer/de-serializers 90 and 90.' Furthermore, there is no reference or other clock or timing signal fed into the serializer/de-serializers for providing a locking reference. The serializer/de-serializers have, as described below, a clock generator that is synchronized and/or gated to the sending and receiving of a data word at a faster rate than required by the system. The present invention employs clock generation that provides a bit clock traveling with the serialized data between the two systems 90 and 90.' This bit clock typically will have an edge that is delayed (either at the sender or the receiver) from the data edges so that the bit clock edge defines the stable portion of a data bit, so as to load the serial bits error free into a receiving register.

As mentioned above, there may be many other variations of the operation and uses of the general block diagram of FIG. 5, and the present invention can be used to advantage in these many applications. Embodiments include the following independent arrangements: a) one direction serializer; b) one direction de-serializer; c) bidirection data lines; d) bidirection bit clock lines; e) unidirectional bit clock lines; f) unidirectional data lines; g) handshaking; h) no handshaking; i) external word load generation; j) internal word load generation; k) free running synchronized pulse generation; l) gated pulse generation; m) starting the serializing by a word load signal and n) starting the serializing by a change in the data. The description of these implementations as "independent" refers to the ability of those skilled in the art to employ virtually any of the enumerated arrangements without respect to the other arrangements, excepting, of course, where the arrangements are mutually exclusive (e.g. using handshaking or not).

Figure 6:
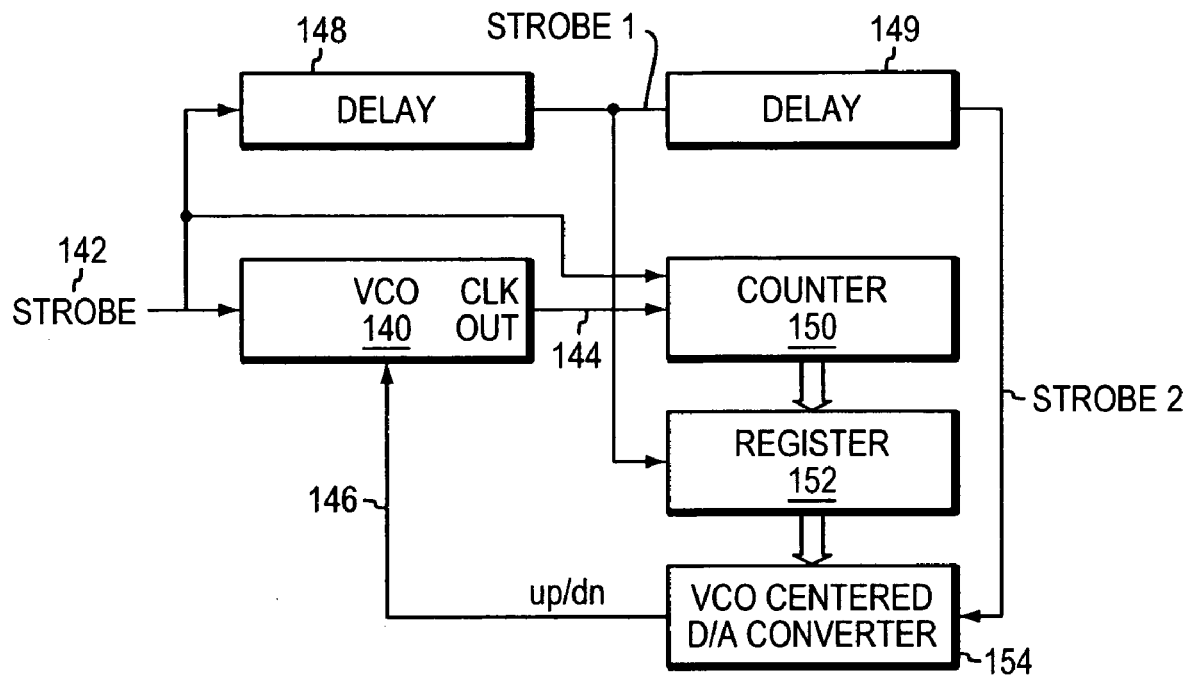
FIG. 6 is a block diagram of clock control circuits.

FIG. 6 is an illustrative block diagram of a clock circuit embodiment of the present invention. A VCO 140 is enabled by a strobe 142 and produces a clock out 144. The frequency of the clock out 144 depends on the DC voltage value of the control input, up/dn, 146. Systems employing the present invention are designed for transferring the serialized data at a slightly, but reliably, higher frequency than that necessary to preserve data integrity. Since the VCO reacts to the DC control voltage 146, that voltage is initially set at a level that ensures that the VCO output begins at that higher frequency. In practice, the strobe 142 is delayed 148 by inverter chains to ensure proper operation of the remaining logic of the circuit of FIG. 6. Typically, race conditions and competing edges are eliminated by these delays, but other circuit measures known to those skilled in the art may be used to ensure proper circuit operation. In an illustrative embodiment, the strobe loads a data word for transmitting, and the clock out signals 144 for that word are counted in a four bit binary counter 150. The output of the counter 150 is fed to a holding register 152 when the data word has been sent. The registers output is fed to the VCO Centered D/A converter 154. The initial output of the D/A converter is offset or otherwise arranged to output a DC voltage that is connected to the control input 146 of the VCO. In the FIG. 6 embodiment, the strobe enables both the VCO to output the clock out 144 and the counter 150 to begin counting clock signals or pulses. After the word is sent, Strobe 1 loads the register 152 from the counter and Strobe 2 enables the D/A converter to accept the register input. If the register input indicates that the count is too high, the up/dn DC level at 146 would decrease so as to lower the frequency of the clock out 144, and if the count was too low the up/dn level 146 would rise to speed up the clock out signal 144 for sending the next data word.

In one preferred embodiment, the counter 150 is a four bit counter, the register 152 holds the four bits, and item 154 contains an eight bit D/A. In this embodiment, the output of the D/A is centered initially to be at about ½ of its DC output range. At that initial level the VCO 140 frequency is designed to be at about 422 MHz. So when the counter contains a count value of 8 (about ½ its four bit range of 16), and that count has been transferred to the register and then the D/A, that level indicates a full eight bits have been processed with the D/A output remaining at its initial centered value and the VCO outputs the 422 MHz. The eight bit D/A is selected with a granularity so that a two bit up or down value in the counter 150 output will result in a change in the VCO frequency from a high of about 435 MHz to a low of about 410 MHz, respectively. In this application, the minimum frequency (to ensure no bits are lost by a too slow clock) is 400 MHz, and the centered frequency of the VCO of 422 MHz is designed to be at a count of +3 from the count that would result in 400 MHz from the VCO. If the count drops below +2 counts, the output of the D/A rises to drive the VCO faster. In this embodiment, the VCO remains in the range of about 410 to 435 MHZ, and the sending and receiving circuits are designed to accept transmissions in this range.

Typically, but not shown, a power on restart signal will bring the DC level of 146 to the designed centered level, whereupon the clock will be ready to output when the strobe 142 occurs. These schematic blocks are well known to those skilled in the art.

Figure 7:
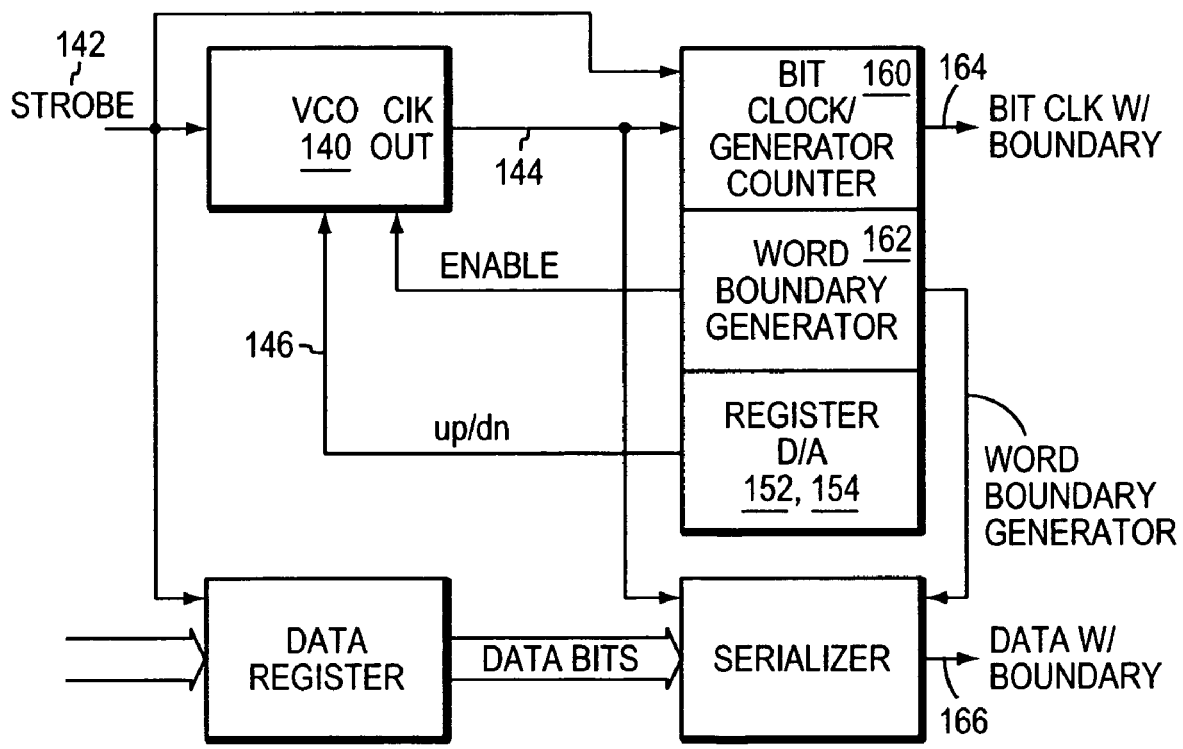
FIG. 7 is a schematic block diagram of a clock system using the circuit of FIG. 6.

FIG. 7 is a block diagram of a preferred embodiment 200 of the present invention, utilizing the configuration shown in FIG. 6. The oscillator 204 is designed to start at a frequency that is faster than required, as described above. A counter 160 tracks the oscillator frequency by counting bits. At a prescribed time, the counter contents 160 are fed to a word boundary generator 162, and the register, VCO centered D/A converter 152, 154. At the strobe time the output UP/DN 146 of the D/A will increment up or down from its centered point and cause the VCO 140 to speed up or slow down, respectively, as described above. The receiving system is designed to discard any data bits that happen during the detection of a word boundary.

In the present example, the sending and receiving systems must be capable of operating reliably with a bit clock frequency about 15% higher than the designated frequency.

FIG. 7 includes a word boundary generator 162 that adds the word boundary, as in FIG. 8 below, to the bit clock output 164. In the present example, the word boundary will be determined by the bit clock having no logic transitions over one, two or more expected bit times, while there is at least one logic transition on the data bit output. The word boundary generator 162 feeds both the bit clock generator/ counter and the data bit output to create the BIT CLK 164 and the data bit necessary to form a data word 166 boundary.

Figure 8:
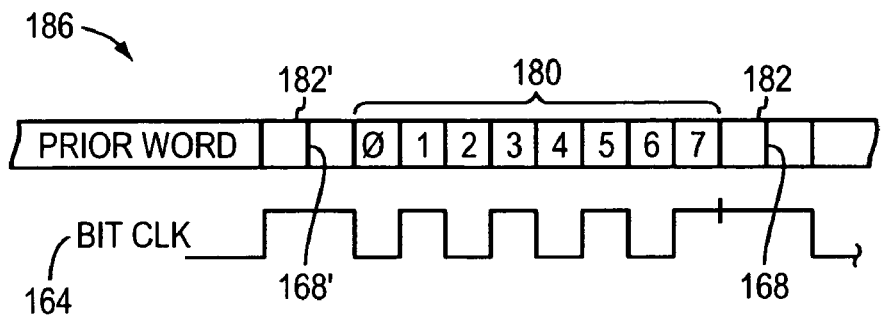
FIG. 8 is a timing diagram showing a data word boundary.

FIG. 8 illustrates the bit clock and data word timing that is output by the present inventive clock circuitry, and as described in the above listed incorporated related patent applications. The present invention serial clock generation requires a receiver that detects the data bits and word boundary as illustrated in FIG. 8. Note, the word boundaries (182, 182') are shown as two bits at the end of eight data bits (a byte). In practice, there may be virtually any number of bits in a word boundary (that are discarded), and the word boundary described can be designed to be at the beginning, the end or dispersed within the word data bits. The bits received after a word boundary was detected would be stored and then assembled, and such designs would be known to those skilled in the art.

In FIG. 8, there are eight data bits 180 that form a word. The word boundary is shown as section 182 that is two bits long and immediately follows the eight bit word. The BIT CLK 164 (bit clock) travels on a cable in parallel with the serial data 166. The BIT CLK 164 has pulses or edges that define each serial bit of the word. In FIG. 8 either a positive going or a negative going BIT CLK 164 edge may be used by the receiver (de-serializer) to receive the data bit into a register. As known to those skilled in the art, the de-serializer receiver may form delays or otherwise condition the data bit stream and/or the BIT CLK to ensure proper receipt of the data bits. But, note that the BIT CLK 164, during the word boundary 182, exhibits no edges, but there is a logic transition 168, 168' on the data bit line. A BIT CLK generator 164, made in accordance with the present invention, indicates a word boundary by the absence of BIT CLK logic transitions in the presence of a logic transition on the data line. There may be additional data bit transitions that are discarded. A de-serializer or other receiver, will make use of this absence feature to isolate each data word in the data bit stream. Such receivers are described in the above referenced patent applications that have been incorporated herein by reference.

Figure 9:
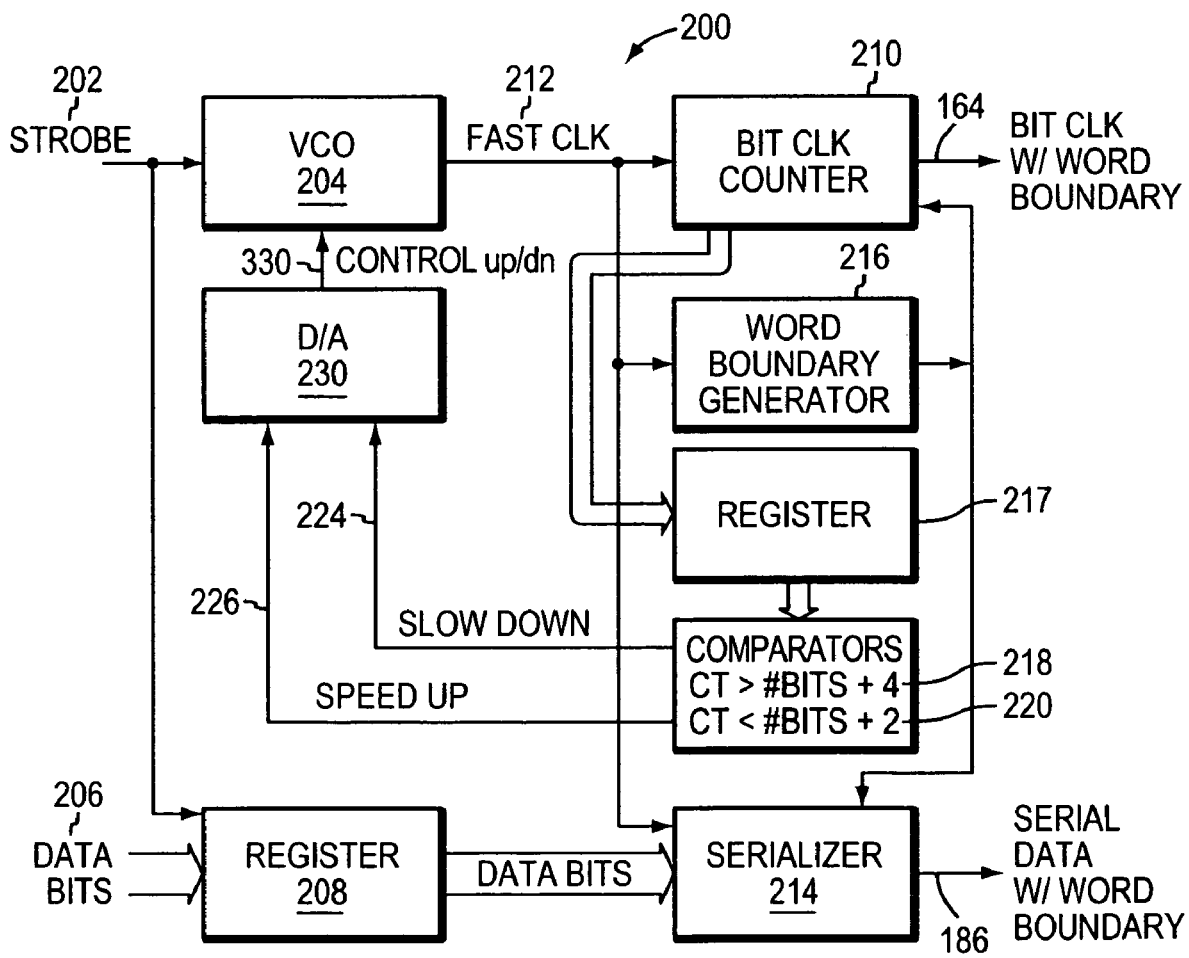
FIG. 9 is another illustrative circuit block diagram incorporating the present invention.

FIG. 9 illustrates another preferred embodiment 200 of the present invention. Here, a strobe 202 loads data word bits 206 into a holding register 208. The strobe 202 starts the VCO 204 and enables the bit clock counter 210. A delayed strobe (not shown) may be used for timing signals among the circuit blocks. The VCO outputs fast clock 212 that is faster than required to ensure data integrity as described above. Each data word is sent out with the bit clock 164 in accordance with the timing shown in FIG. 8. In this embodiment, a word boundary generator 216 logically forces the bit clock 164 to be at a logic constant high or low during a word boundary. The word boundary generator 216 also causes a logic level transition (either low to high or high to low) on the serial data line 186. In this embodiment, a register 217 holds the bit clock counter value and two logic comparators, 218 and 220 compare the register value with a high threshold (#bits+4) and a low threshold (#bits+2). The #bits being the set point where the t)/A 230 outputs control DC value that keeps the VCO at the initial slightly higher than necessary frequency. If the register value is greater than the high value, the VCO frequency needs to be slowed and a slow down signal 224 is generated and sent to the D/A. The D/A 230 lowers the control Dc voltage and the VCO frequency is reduced. Similarly, if the register value is too low, a speedup signal 226 is generated and, via the D/A, the VCO frequency increases.

Figure 10:
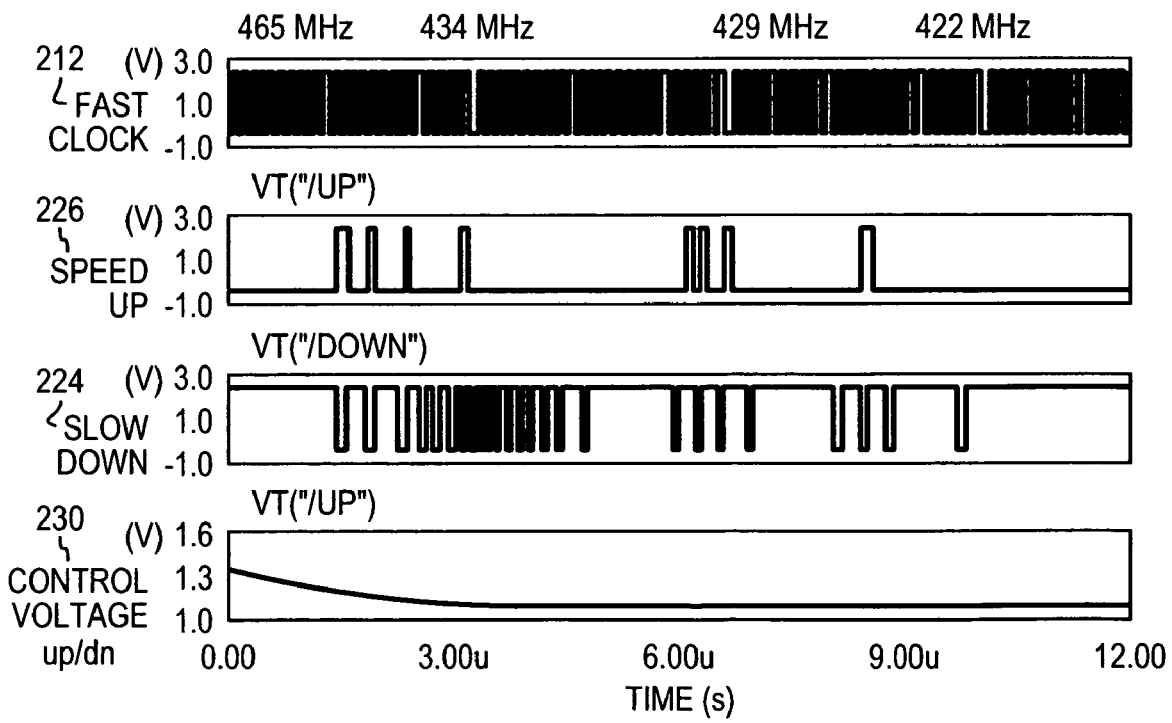
FIG. 10 is a timing diagram of control signals.

FIG. 10 illustrates the particular clock/data outputs of an embodiment of the present invention as described for FIGS. 6–8. The fast clock output 212 of the oscillator 204 is designed to always start at a faster than needed frequency. In this example, the fast clock starts when first enabled at 465 MHz. The speedup signal 226 is not asserted and the slowdown signal 224 is asserted. As shown in the graph, the fast clock slows uniformly down to 422 MHz, where it remains stable. In this particular embodiment, the net results of the slowdown and the speedup signals to the 204 is a control voltage (or current) 250 that drives the VCO. As shown, the higher control voltage 250 indicates a dn signal at about +1.4 V falls to about +1.1 V indicating a stable signal over a six second time period. If the clock slowed down, the control voltage would decrease below +1.1 V an up signal would be generated and the speed up signals would increase. Again, the stable point would be reached at +1.1 V.

The following text describes particular, but non-exhaustive, preferred embodiments of the present invention.

Figure 11:
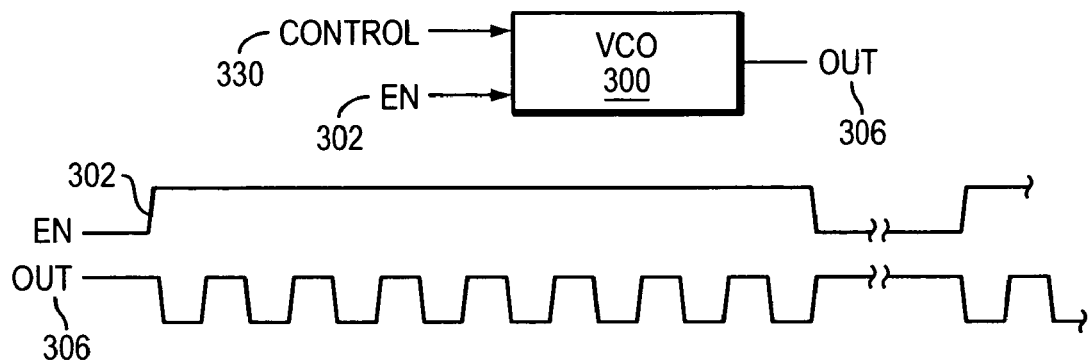
FIG. 11 is a circuit/block diagram showing start control of a VCO.

FIG. 11 shows an enabled VCO oscillator 300. Here, when the EN signal 302 is true, the oscillator will output a series of pulses OUT 306 whose frequency depends on the value of the CONTROL input DC voltage 330. In one embodiment, the VCO may be a ring of inverters with a Schmitt trigger with hysteresis controlled by the CONTROL voltage. The enable pulse EN 302 occurs concurrently when a data word has been input into a shift register for sending from a computing system. If the delay through each inverter is about 0.5 nsec, the oscillation frequency would be about 500 MHz. With the present invention there is no delay waiting for a PLL to lock.

Figure 12:
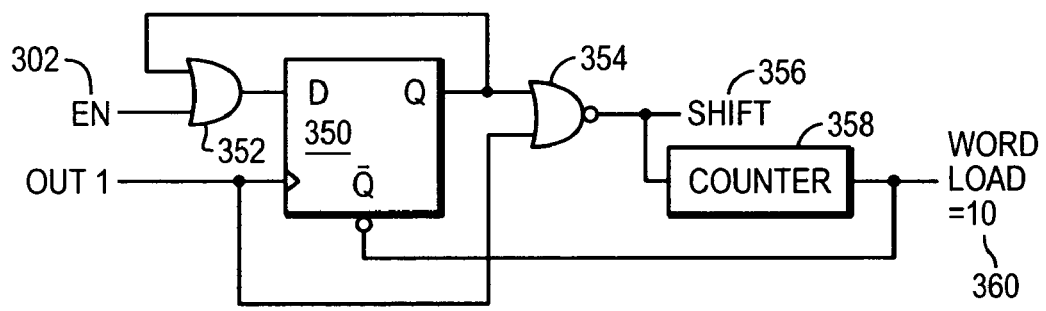
FIG. 12 is a circuit showing word loading.

FIG. 12 illustrates a circuit that synchronizes bit clock pulses to a signal that loads a new word for sending. OUT 1 is a free running clock signal, say like the OUT signal of FIG. 10. The D flop 350 is unresponsive until EN1 goes true. At the next OUT1 pulse, the flop 350 is set and the feed back path through the NOR gate 352 maintains the set status of the flop 350. After the flop 350 is set, the succeeding OUT1 pulse is gated by the NAND 354 to form a shift pulse 356. This shift pulse shifts the data bits out from a holding register (not shown) via a cable to a receiving system. The counter 358 is set up to form a WORD LOAD 360 that resets the flop 350 when a full data bit word has been shifted out. This WORD LOAD also is used to create the WORD BOUNDARY by preventing the BIT CLK from having a logic transition after the data bits that form a full word have been sent. This prevention may be by a NAND gate, as known to those skilled in the art.

As is known in the art, pulse generators will typically be compensated for voltage and temperature variations.

Figure 13:
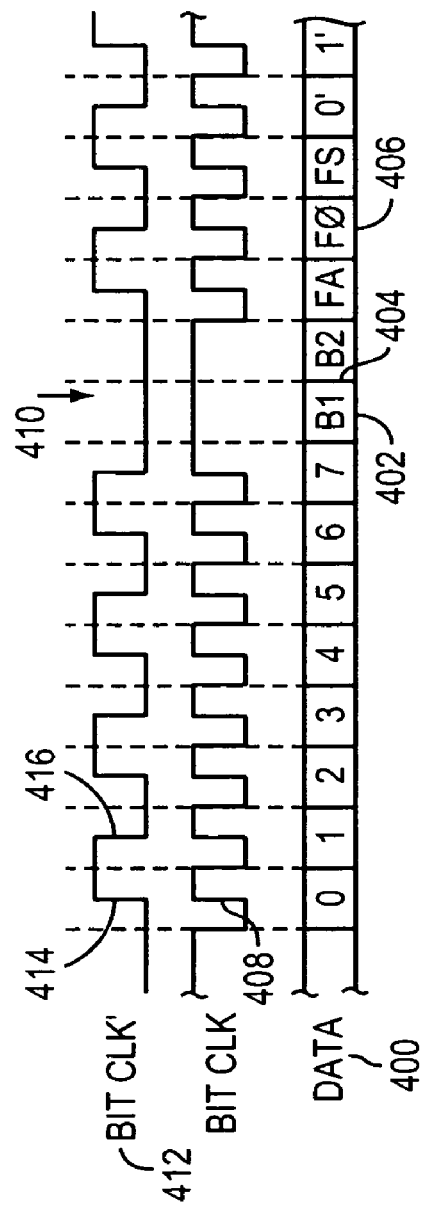
FIG. 13 is a timing diagram illustrating word boundaries.

FIG. 13 shows a bit clock scheme with word data bits 400, boundary bits 402, and filler bits 406. In this case, a different number of filler bits 408 may be sent between different words. Also, shown is an embodiment where the data is latched on the rising edge 408 only of the bit-clock. The bit clock, in such a case as seen from the drawing, runs at twice the data clock frequency. Eight word data bits, 0–7, are stable during the rising edge 408 of the bit clock as sent or as received. In this case, the word boundary bits B1 and B2 are shown with a data bit edge 404 occurring while the bit clock is high. This is the logic operation that defines the word boundary. Note that the edge 404 is a rising edge, but it may be falling on the next or another word boundary. However, in this case, there are filler bits FA, FB, and FC that occur prior to the next data word bit 0.' In this example, the eight data bits are those just preceding the word boundary. BIT CLK' 412 provides for latching the data bits on either a rising 414 or a falling 416 bit clock edge and thereby not to have a double frequency data clock. Logic implementation to accomplish this is known in the art. In this case, the BIT CLK' is at a constant low 418 during the word boundary. The bit clock at the word boundary can be either high or low, and the polarity of the bit clock may be high for one word and low for another within the same data word stream.

Figure 14:
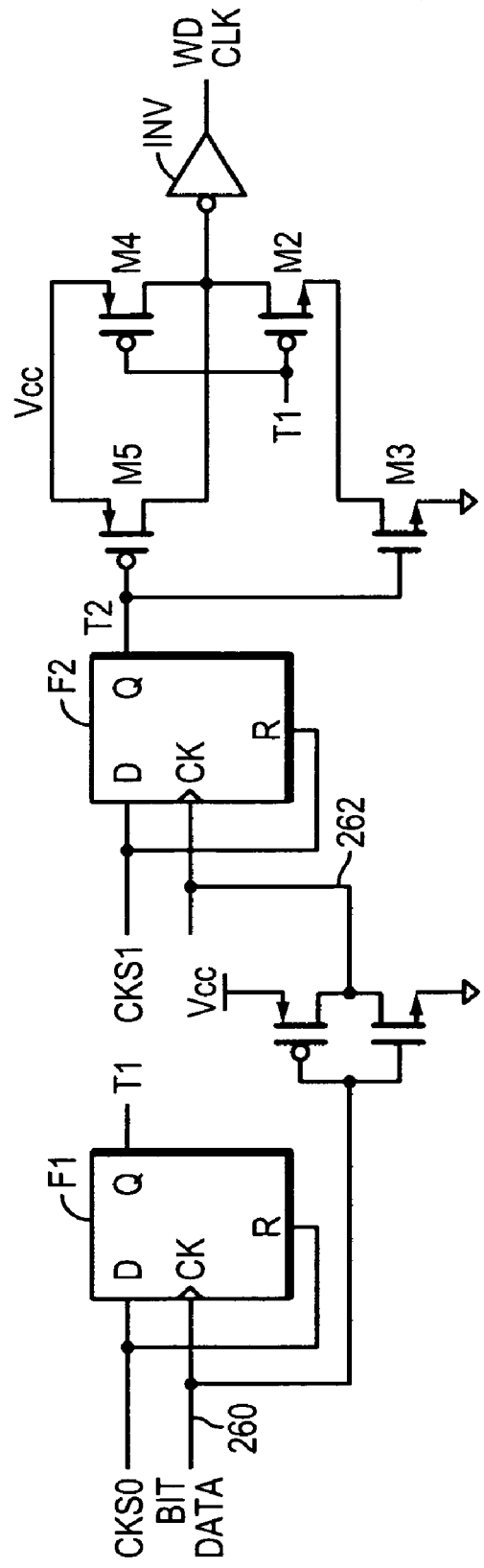
FIG. 14 is a schematic circuit illustrating word/data timing and control.

When a system is sending data, the word boundaries are predetermined, so deleting a clock pulse is straight forward, but not so when receiving serial data. FIG. 14 shows one logic circuit that can be used to detect a missing clock pulse during a data bit transition (the sender always requiring a transition of the data stream during the word boundary). F1 and F2 are D type flip flops with the received bit data 260 fed to the clock input of F1 and the bit data inverted 262 fed to the clock of F2. The D inputs and the resets of both flops are connected to the received bit clock CKS1. CMOS transistors M2, M3, M4, and M5 are arranged as an AND with an inverter INV to form a NAND circuit with inputs T1 and T from the flop outputs, and an output is the word clock WDCLK. In operation, when CKS1 is low, both flops are reset and t1 and t2 are low. So the WDCLK is low. When CKS1 is high and data transitions occur, either t1 or t2 will go high, but not both. On the next low going CKS1 edge, both flop outputs will again go low. When CKS1 is high for two consecutive bit times and data toggles high and low during this period, both t1 and t2 will go high and via the NAND WDCLK will go high. On the next falling edge of CKS1, WDCLK will go low.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A clock circuit for outputting serial data bits defining a data word, the clock circuit comprising:
   an oscillator with an output and a control signal input, wherein the output carries bit clock pulses with a frequency responsive to the control signal input, and wherein the oscillator is designed to start a frequency higher than a previously set level, the set level being higher than that necessary to preserve the output data bit integrity;
   a comparator that compares the clock frequency with the set level and outputs a responsive control signal to the oscillator control signal input, wherein, if the clock frequency is higher than the set level, the responsive control slows the clock frequency, and if the clock frequency is lower than the set level, the responsive control signal speed up the clock frequency; and
   means for preventing a bit clock pulse from occurring and for ensuring that there is a data bit transition during the missing clock pulse time, wherein the combination of the missing bit clock pulse and the data bit transition defines a data word.

2. The clock circuit of claim 1 wherein the combination of the missing bit clock pulse and the data bit transition may occur in the beginning, in the middle or at the end of the data word.

3. The clock circuit of claim 1 wherein the control input comprises two inputs, one that accepts the speed up signal from the means for comparing, and the second that accepts the slow down signal.

4. The clock circuit of claim 1 further comprising:
   means for setting a high threshold and a low threshold, wherein the comparator compares the clock frequency to the high and the low thresholds, wherein the slow down signal is activated only when the clock frequency exceeds the high threshold, and the speed up signal is activated only when the clock frequency is below the low threshold.

5. The clock circuit of claim 1 wherein the means for preventing comprises logic circuits that define a data word by "anding" the logic level of the bit clock signal indicating a missing clock pulse and the data transition.

6. A clock circuit for outputting serial data bits defining a data word, the clock circuit comprising:
   an oscillator with an output and a control signal input, wherein the output carries bit clock pulses with a frequency responsive to the control signal input, and wherein the oscillator is designed to start a frequency higher than a previously set level, the set level being higher than that necessary to preserve the output data bit integrity;
   a comparator that compares the clock frequency with the set level and outputs a responsive control signal to the oscillator control signal input, wherein, if the clock frequency is higher than the set level, the responsive control slows the clock frequency, and if the clock frequency is lower than the set level, the responsive control signal speeds up the clock frequency;
   means for preventing a bit clock pulse from occurring and for ensuring that there is a data bit transition during the missing clock pulse time, wherein the combination of the missing bit clock pulse and the data bit transition defines a data word; and
   means for setting a high threshold and a low threshold, wherein the comparator compares the clock frequency to the high and the low thresholds, wherein the slow down signal is activated only when the clock frequency exceeds the high threshold, and the speed up signal is activated only when the clock frequency is below the low threshold.

7. A method for outputting serial data bits defining a data word, the method comprising the steps of:
   outputting bit clock pulses with a frequency responsive to a control signal input, wherein the bit clock pulses start at a frequency higher than a previously set level, the set level being higher than that necessary to preserve the output data bit integrity;
   comparing the clock frequency with the set level and outputting a responsive control signal to the control signal input, wherein, if the clock frequency is higher than the set level, the responsive control slows the clock frequency, and if the clock frequency is lower than the set level, the responsive control signal speeds up the clock frequency; and
   preventing a bit clock pulse from occurring and for ensuring that there is a data bit transition during the missing clock pulse time, wherein the combination of the missing bit clock pulse and the data bit transition defines a data word.

8. The method of claim 7 wherein the combination of the missing clock pulse and the data bit transition may occur in the beginning, in the middle or at the end of the data word.

9. The method of claim 7 further comprising the steps of:
   setting a high threshold and a low threshold with respect to the set level, wherein step of comparing compares the clock frequency to the high and the low thresholds, and wherein the slow down signal is activated only when the clock frequency exceeds the high threshold, and the speed up signal is activated only when the clock frequency is below the low threshold.

10. The method of claim 7 wherein the step of preventing a bit clock pulse comprises the steps of defining a data word by "anding" the logic level on the bit clock signal indicating a missing bit clock pulse and the data transition.

* * * * *